United States Patent
Surlekar et al.

(10) Patent No.: US 6,205,061 B1
(45) Date of Patent: Mar. 20, 2001

(54) EFFICIENT BACK BIAS ($V_{BB}$) DETECTION AND CONTROL SCHEME FOR LOW VOLTAGE DRAMS

(75) Inventors: Vipul Surlekar, Mumbai (IN); Sadashiva Rao, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/437,642

(22) Filed: Nov. 10, 1999

Related U.S. Application Data

(62) Division of application No. 08/993,798, filed on Dec. 18, 1997.

(30) Foreign Application Priority Data

Jul. 31, 1997 (IN) .......................................... 1714/MAS/97

(51) Int. Cl.⁷ ...................................................... G11C 7/00
(52) U.S. Cl. .................................. 365/189.05; 365/185.25
(58) Field of Search .......................... 365/189.09, 185.25

(56) References Cited

U.S. PATENT DOCUMENTS 5,642,313 * 6/1997 Ferris .............................. 365/185.25

* cited by examiner

Primary Examiner—David Nelms
Assistant Examiner—M. Tran
(74) Attorney, Agent, or Firm—Frank D. Cimino; W. James Brady; Frederick J. Telecky, Jr.

(57) ABSTRACT

An efficient back bias ($V_{BB}$) detection and control circuit make possible a low voltage memory device and includes an on-chip $V_{BB}$ level sensor (38) that includes a dynamic voltage reference shift circuit (40, 42, 44, 46) for establishing a first voltage level (−(|2VTP|+VTN)) during power-up and a second voltage level (−|2VTP|) during normal operation. The first voltage level is of a deeper level for achieving a short power-up interval. The second voltage level has a level less deep than said first voltage for achieving low power operation.

29 Claims, 1 Drawing Sheet

EFFICIENT BACK BIAS ($V_{BB}$) DETECTION AND CONTROL SCHEME FOR LOW VOLTAGE DRAMS

This is a divisional of application Ser. No. 08/993,798 filed Dec. 18, 1997, which claims priority to India application, Serial No. 1714/MAS/97 of inventor Surelkar, et al., filed Jul. 31, 1997.

TECHNICAL FIELD OF THE INVENTION

The present invention relates to integrated circuits systems that include integrated circuits and, more particularly, to memory circuits such as dynamic random access memory (DRAM) circuits and, even more particularly, to back bias ($V_{BB}$) detection and control schemes for low voltage DRAM circuits.

BACKGROUND OF THE INVENTION

Achieving proper operation of a memory circuit, such as a DRAM, typically requires an initial pause of 200 μsec followed by a minimum of eight initialization cycles after reaching the full $V_{CC}$ level. Within the generally specified power-up pause of 200 μsec, reliable DRAM operation demands on-chip generated back bias voltage ($V_{BB}$). Providing the needed $V_{BB}$ reduces junction capacitance, reduces substrate leakage and prevents forward biasing of junctions. Generating a deep $V_{BB}$ level within the specified power-up, however, becomes difficult at low operating voltages (e.g., approximately 3.3 V). This is particularly true if the $V_{BB}$ load capacitance is high, such as is the case for sub-micron technologies and higher DRAM densities. For instance, the typical $V_{BB}$ load capacitance of a 16 Mb DRAM employing trench capacitor cells as storage elements is about 240 nf.

One type of circuit design for initializing and enabling peripheral circuits on a memory chip generates internally a positive pulse RID(RAS_ Input Disable). In this circuit, RID is designed to go positive as soon as power-on conditions are detected and reset when $V_{BB}$ reaches a preset level. The resetting is usually accomplished by means of an analog sensor, which detects when the $V_{BB}$ level is 2Vtn below ground. For example, TABLE 1 documents RID trip points for the 16 Mb shrink (16 MS) low voltage (3.3 V) DRAM fabricated using 0.5 μm technology. As TABLE 1 shows, RID reset is marginal to the power-up specification of 200 μs at 2.6 V, 100° C. and using a MSIG (minus sigma) process model.

TABLE 1

16 MS SIMULATION RESULTS

| SIMULATION CONDITIONS/MODEL | RID TRIP POINT | VBB @ RID |
| --- | --- | --- |
| 2.6 V, 100 C.|MSIG | 203 us | −0.89 V |
| 4.0 V, −10 C.|PSIG | 45 us | −1.12 V |

Of particular importance is the fact that if RID is not reset within the power-up spec time, then the device operation cannot be guaranteed.

In other words, this method uses RID to manipulate $V_{BB}$ pumping during power-up in the memory device. RID is made a function of $V_{BB}$, through a predetermined level sensor. $V_{BB}$ pumping starts as soon as power-on is detected and stops after RID is reset. Such a scheme may be inadequate for low voltage operations, because at 16 MB densities, higher substrate capacitances result. Thus, $V_{BB}$ may not reach a deep enough level to reset RID. This will keep the device in initialization mode, and prohibit normal memory device operation.

One method to reset RID expeditiously is to pump harder the $V_{BB}$, so that RID reset is not marginal to spec. Usually, $V_{BB}$ pumping during power-up is stopped after RID is reset. This method extends pumping beyond RID reset so that the $V_{BB}$ level is deep on power-up. As the process models/operating conditions change, if pumping is extended uncontrolled, $V_{BB}$ becomes too deep and may adversely affect memory device operation.

SUMMARY OF THE INVENTION

In light of the above limitations, there is a need for an improved memory device initialization circuit that avoids the limitations by providing a sufficiently deep and prompt back bias supply for a memory device during power-up, but which back bias supply is not too deep for normal low voltage operation.

The present invention, therefore, provides a back bias control circuit for a memory device, such as a DRAM, that eliminates or substantially reduces the slow and low voltage power-up problems affecting known back bias supply circuits.

According to one aspect of the invention, there is provided an efficient back bias ($V_{BB}$) detection and control circuit that makes possible a low voltage memory device and thus includes an on-chip $V_{BB}$ level sensor having a dynamic voltage reference shift circuit for establishing a first voltage level during power-up and a second voltage level during normal operation. The first voltage is of a deeper level to achieve a short power-up interval. The second voltage level is of a level less deep than the first voltage for achieving low power operation.

According to another aspect of the invention, there is provided an on-chip $V_{BB}$ level sensor that chooses a −(|2VTP|+VTN) reference during power-up and a −(|2VTP|) reference after power-up. A power-up complete signal is combined with the sensor output to conditionally bypass the extra N-channel transistor in the sensor circuit, thus changing the sensing level from −(|2VTP|+VTN) to −(|2VTP|) dynamically. The sensor output is used to keep the pumps, including a booster pump, a high power pump, and a low power pump, for example, enabled until a deep $V_{BB}$ condition is detected. This quickens the substrate pumping enabling us to achieve deeper $V_{BB}$ level in a shorter time interval. The feedback path ensures that until the power-up condition is reached, −(|2VTP|+VTN) sensing is enabled. The on-chip $V_{BB}$ detection and control circuit cuts off all extra pumping once deep $V_{BB}$ is sensed by the sensor. Once the memory device reaches the powered-up condition, the present invention enables the feedback path to N-channel transistor. This results in bypassing the N-channel transistor. From this point onward, only the −(|2VTP|) reference level appears in the sensor input path.

A technical advantage of the present invention is its use of an on-chip oscillator that helps low power operation. The on-chip oscillator makes use of the dynamically reconfigured −(2VTP) level sensor (described above), during normal operation.

A technical advantage of the present invention is that it provides for RID resetting at a relatively shallow $V_{BB}$ level. The present invention, therefore, allows the device to initialize within the specified time for the DRAM and pumps are not cut off. This allows $V_{BB}$ to reach a deep level.

Other technical advantages that the present invention provides is achieving desired (deep) $V_{BB}$ level with shorter power-up interval, and reconfiguring of the same sensor for low power operation once the sensor circuit detects the powered-up condition.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the figures like numerals being used to refer to like and corresponding parts of the various drawings.

Figure 1:
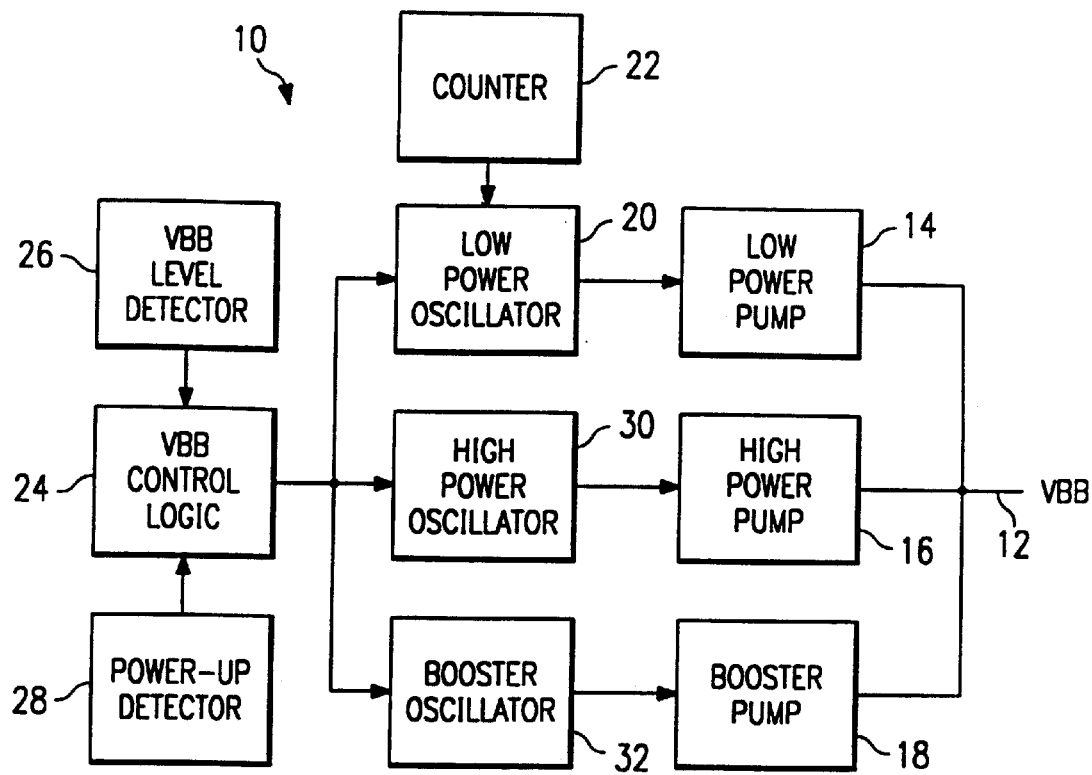
FIG. 1 is a block diagram of a $V_{BB}$ generation system of the present invention.

FIG. 1 shows $V_{BB}$ control circuit 10 of the present invention for generating and regulating the back bias voltage level for an associated memory device, such as a DRAM. In $V_{BB}$ control circuit 10, the $V_{BB}$ voltage level output 12 is controlled by the combined outputs of low power pump circuit 14, high power pump circuit 16, and booster pump circuit 18. Low power oscillator 20 receives input from counter circuit 22 and $V_{BB}$ control logic circuit 24, which receives input from $V_{BB}$ level detector circuit 26 and power-up detector circuit 28. $V_{BB}$ control logic circuit 24 also feeds high power oscillator circuit 30 and booster oscillator circuit 32. High power oscillator circuit 30 provides input to high power pump 16, while booster pump circuit 18 receives input from booster oscillator circuit 32.

Low power pump circuit 14 supplies current that is generally consumed by substrate leakage, when the device is in the standby mode of operation. High power pump circuit 16 supplies substrate current during the active cycle of $V_{BB}$ control circuit 10. Booster pump circuit 18 provides a boost voltage during initial power-up, as well as in the event that $V_{BB}$ goes shallow. Variable frequency, low power oscillator 20 pumps low power pump circuit 14. High frequency, high power oscillator 30 pumps high power pump circuit 16, while booster oscillator circuit 32 pumps booster pump circuit 18. Low power pump circuit 14 and high power pump circuit 16 also pump $V_{BB}$ during initial power-up.

Variable frequency, low power oscillator circuit 20 provides low power operation, with its frequency varying according to the $V_{BB}$ level. The deeper the $V_{BB}$ level, the lower the oscillator frequency and, therefore, the lower the power consumption. The low power oscillator works off a −2Vtp $V_{BB}$ level sensor to control its frequency.

Figure 2:
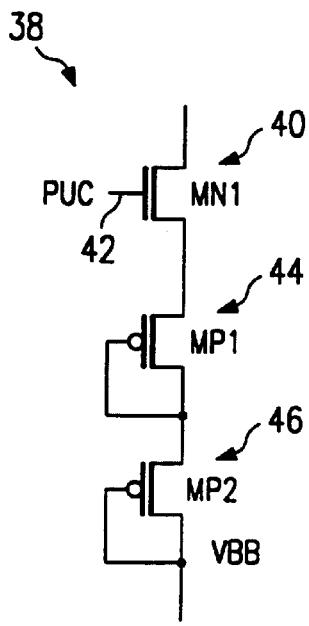
FIG. 2 is a schematic diagram of a sensor circuit used in the low power oscillator of FIG. 1.

Counter circuit 22 counts a fixed time interval after RID reset. The counter count output from counter circuit 22 determines the amount of time for which pumping is to be extended. FIG. 2 shows one embodiment of level sensor circuit 38 of the present invention, which is part of low power oscillator circuit 20. Level sensor circuit 38 includes N-channel transistor 40 that receives a power-up complete signal at line 42. Level sensor circuit 38 also includes P-channel transistors 44 and 46. After the memory device power supply is turned on, power up complete (PUC) signal on line 42 is low and the level sensor circuit 38 is configured for sensing a level of −(2Vtp+Vtn).

The PUC signal can go high under two conditions. One condition is when RID goes low and the counter circuit 22 preset count is complete. The other condition is when $V_{BB}$ value goes below −(2Vtp+Vtn). In the first condition, PUC signal 42 goes high and N-channel transistor 40 is fully turned on. At this point, the sensor is configured for −2Vtp detection. In the second case, a $V_{BB}$ level below −(2Vtp+Vtn) is detected which, in turn, causes PUC signal 42 to go high and configures level sensor circuit 38 for −2Vtp detection. While the first case occurs at the slow corner (low voltage and slow process parameters) of the circuit characteristic curve, the second case occurs at the fast corner (high voltage and fast process parameters) of the circuit characteristic curve.

For level sensing circuit 38, the sensing level of −(2Vtp+Vtn) keeps an upper bound on the $V_{BB}$. This avoids the problem of $V_{BB}$ going too deep at the fast corner. After power-up is complete, the sensing level of −(2Vtp+Vtn) is no longer necessary and a sensing level of −2Vtp is sufficient to control the low power oscillator 20.

After power-up, N-channel transistor 40 fully turns on and the sensing level dynamically changes from −(2Vtp+Vtn) to −2Vtp. The dynamic reconfiguration of the −(2Vtp+Vtn) sensor allows using the same sensor both during power-up and during normal operation. This eliminates the need for two different sensors, thereby saving leakage current, and ultimately lowering power operation.

TABLE 2 shows the simulation results for one embodiment of the present invention to illustrate the effect of the present invention with a 16 MB shrink low voltage (3.3 V) DRAM.

TABLE 2

Simulation Results of Invention

| SIMULATION CONDITIONS/MODEL | RID TRIP POINT | $V_{BB}$ @ RID | $V_{BB}$ @ PUC |
| --- | --- | --- | --- |
| 2.6 V, 100 C.\|MSIG | 123 us | −0.95 V | −1.22 V |
| 3.3 V, 27 C.\|MEAN | 60 us | −1.15 V | −1.54 V |
| 4.0 V, −10 C.\|PSIG | 32 us | −1.20 V | −1.78 V |

To summarize, the present invention provides an on-chip $V_{BB}$ level sensor that chooses a −(|2VTP|+VTN) reference during power-up and a −(|2VTP|) reference after power-up. With the present invention, a power-up complete signal is combined with the sensor output to conditionally bypass the extra N-channel transistor in the sensor circuit. This dynamically changes the sensing level from −(|2VTP|+VTN) to −(|2VTP|). Sensor circuit 38 of the preferred embodiment provides output that keeps the pump circuits 14, 16, and 18 enabled during power-up until it detects a deep $V_{BB}$ condition. This makes substrate pumping faster, thereby permitting a deeper $V_{BB}$ level in a shorter time interval. The feedback path that the present invention provides ensures that until the memory device reaches the powered-up condition −(|2VTP|+VTN) sensing is enabled. The present invention cuts off extra pumping once sensor circuit 38 senses deep $V_{BB}$. Once the memory device reaches powered-up condition, the feedback path to N-channel transistor is permanently enabled, and thereby bypassed. From this point onward, only the −(|2VTP|) reference level appears in the sensor path. Sensor circuit 38 preferably resides on-chip in low power oscillator and helps low power operation. Thus $V_{BB}$ is pumped deeper during power-up.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A voltage detection circuit to sense the level of an on-chip generated voltage comprising:
    a first diode-connected transistor having its current path connected between a voltage terminal having the generated voltage thereon and a first node;
    a second transistor having its current path connected between the first node and an output node, and wherein the gate of the second transistor is connected to a control signal, the control signal being at an inactive voltage level during a first time frame of operation thereby enabling the second transistor during the first time frame of operation only if the generated voltage reaches a particular threshold level, and the control signal being at an active voltage level during a second time frame of operation, separate from the first time frame of operation, thereby enabling the second transistor for the second time frame of operation.

2. The voltage detection circuit of claim 1, wherein the active voltage level is a high logic level and the inactive voltage level is a low logic level.

3. The voltage detection circuit of claim 1, wherein the first diode connected transistor is a P-channel transistor and wherein the second transistor is a N-channel transistor.

4. The voltage detection circuit of claim 1 further comprising a second diode-connected transistor having its current path connected in series with the first diode-connected transistor and the second transistor.

5. The voltage detection circuit of claim 1, wherein the first time frame of operation is power-up, and the second time frame of operation is normal operation.

6. The voltage detection circuit of claim 1, wherein the voltage detection circuit is located on an integrated circuit comprising a low voltage dynamic random access memory (DRAM) device.

7. The voltage detection circuit of claim 1, wherein the generated voltage is a back bias ($V_{BB}$) voltage.

8. The voltage detection circuit of claim 1, wherein the output node of the voltage detection circuit is coupled to a first oscillator; and
    wherein the voltage detection circuit generates an output signal on the output node; and
    wherein the first oscillator is controlled by the output signal on the output node.

9. The voltage detection circuit of claim 8, wherein the output node is also coupled to a second oscillator; and
    wherein the second oscillator is controlled by the output signal on the output node.

10. The voltage detection circuit of claim 9, further including a first pump circuit and a second pump circuit and wherein the first pump circuit is coupled to the first oscillator and the second pump circuit is coupled to the second oscillator.

11. The voltage detection circuit of claim 1, wherein the output node of the voltage detection circuit is coupled to a variable frequency oscillator; and
    wherein the voltage detection circuit generates an output signal on the output node; and
    wherein the frequency of the variable frequency oscillator is controlled by the output signal on the output node.

12. A voltage detection circuit to detect the level of an on-chip generated voltage comprising:
    a first diode-connected transistor and a second transistor having their current paths connected in series between a voltage terminal having the generated voltage thereon and a first node; and
    wherein the gate of the second transistor is connected to a control signal, the control signal being at an inactive voltage level during a first time frame of operation thereby enabling the second transistor during the first time frame of operation only if the generated voltage reaches a particular threshold level and thus including the second transistor in the sensing of the generated voltage, and the control signal being at an active voltage level during a second time frame of operation, separate from the first time frame of operation, thereby enabling the second transistor during the second time frame of operation and bypassing the second transistor in the sensing of the generated voltage.

13. The voltage detection circuit of claim 12, wherein the active voltage level is a high logic level and the inactive voltage level is a low logic level.

14. The voltage detection circuit of claim 13, wherein the first diode-connected transistor is a P-channel transistor and wherein the second transistor is an N-channel transistor.

15. The voltage detection circuit of claim 12 further comprising a second diode-connected transistor also having its current path connected in series with the first diode-connected transistor and the second transistor.

16. The voltage detection circuit of claim 12 wherein the first time frame of operation is power-up, and the second time frame of operation is normal operation.

17. The voltage detection circuit of claim 12 wherein the voltage detection circuit is located on an integrated circuit comprising a dynamic random access memory (DRAM) device; and
    wherein the generated voltage is a back bias ($V_{BB}$) voltage.

18. The voltage detection circuit of claim 12, wherein the first node of the voltage detection circuit is coupled to a first oscillator; and
    wherein the voltage detection circuit generates an output signal on the first node; and
    wherein the first oscillator is controlled by the output signal on the first node.

19. The voltage detection circuit of claim 18, wherein the first node is also coupled to a second oscillator; and
    wherein the second oscillator is controlled by the output signal on the first node.

20. The voltage detection circuit of claim 19, further including a first pump circuit and a second pump circuit and wherein the first pump circuit is coupled to the first oscillator and the second pump circuit is coupled to the second oscillator.

21. The voltage detection circuit of claim 12, wherein the first node of the voltage detection circuit is coupled to a variable frequency oscillator; and
    wherein the voltage detection circuit generates an output signal on the first node; and
    wherein the frequency of the variable frequency oscillator is controlled by the output signal on the first node.

22. A voltage detection circuit to detect a first level of an on-chip generated voltage during a first time frame of operation and to detect a second level of the on-chip generated voltage during a second time frame of operation, comprising:

a first diode-connected transistor and a second transistor having their current paths connected in series between a voltage terminal having the generated voltage thereon and a first node, the gate of the second transistor being connected to a control signal; and wherein the control signal is at an inactive voltage level during the first time frame of operation thereby enabling the second transistor during the first time frame of operation only if the generated voltage reaches the first level and thus including the threshold voltage (Vt2) of the second transistor in determining the first level of the generated voltage to be sensed during the first time frame of operation; and wherein the control signal is at an active voltage level during the second time frame of operation, the second time frame of operation being separate from the first time frame of operation, thereby enabling the second transistor during the second time frame of operation and thus not including the threshold voltage (Vt2) of the second transistor in determining the second level of the generated voltage being sensed during the second time frame of operation.

23. The voltage detection circuit of claim 22, wherein the active voltage level is a high logic level and the inactive voltage level is a low logic level.

24. The voltage detection circuit of claim 22 further comprising a second diode-connected transistor connected in series between the first diode-connected transistor and the second transistor.

25. The voltage detection circuit of claim 22, wherein the first time frame of operation is power-up, and the second time frame of operation is normal operation.

26. The voltage detection circuit of claim 22, wherein the voltage detection circuit is located on an integrated circuit comprising a dynamic random access memory (DRAM) device; and wherein the generated voltage is a back bias ($V_{BB}$) voltage.

27. The voltage detection circuit of claim 22, wherein the first diode-connected transistor is a P-channel transistor and wherein the second transistor is an N-channel transistor.

28. The voltage detection circuit of claim 26, wherein the first diode-connected transistor is a P-channel transistor and wherein the second transistor is an N-channel transistor.

29. The voltage detection circuit of claim 28, wherein the P-channel transistor has a threshold voltage of |Vtp| and the N-channel transistor has a threshold voltage of Vtn and wherein the value of the first level of the generated voltage is −(|2Vtp|+Vtn) and the value of the second level of the generated voltage is −(|2Vtp|).

* * * * *